United States Patent
Bowles et al.

(10) Patent No.: US 10,250,270 B2
(45) Date of Patent: Apr. 2, 2019

(54) FRACTIONAL CLOCK GENERATOR WITH RAMP CONTROL INCLUDING FIXED TIME INTERVAL AND COARSE/FINE FREQUENCY CHANGE STEPS

(71) Applicant: QUALCOMM Incorporated, San Diego, CA (US)

(72) Inventors: Kevin Bowles, Mission Viejo, CA (US); Dipti Ranjan Pal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/987,208

(22) Filed: May 23, 2018

(65) Prior Publication Data

US 2018/0278261 A1  Sep. 27, 2018

Related U.S. Application Data

(62) Division of application No. 15/453,712, filed on Mar. 8, 2017, now Pat. No. 10,014,869.

(51) Int. Cl.
  *H03L 7/197* (2006.01)
  *H03K 21/10* (2006.01)
  *H03K 3/017* (2006.01)
  *H03L 7/085* (2006.01)
  *H03K 5/00* (2006.01)

(52) U.S. Cl.
  CPC .......... *H03L 7/1974* (2013.01); *H03K 3/017* (2013.01); *H03K 21/10* (2013.01); *H03L 7/085* (2013.01); *H03K 2005/00013* (2013.01)

(58) Field of Classification Search
  CPC ... H03L 7/1974; H03L 7/1976; H03L 7/1978; H03L 7/199; H03L 7/085; H03K 21/10; H03K 2005/00013
  See application file for complete search history.

(56) References Cited

U.S. PATENT DOCUMENTS 8,258,839 B2  9/2012  Erdogan
8,433,944 B2  4/2013  Das et al.
(Continued)

OTHER PUBLICATIONS

International Search Report and Written Opinion—PCT/US2018/018623—ISA/EPO—dated Jun. 6, 2018.
(Continued)

*Primary Examiner* — Jung Kim
(74) *Attorney, Agent, or Firm* — Loza & Loza, LLP/Qualcomm (57) ABSTRACT

A clock signal generator including a fractional clock divider and a frequency ramp control circuit. The fractional clock divider is configured to generate an output clock signal with a frequency being a divider ratio multiplied by a frequency of an input clock signal. The frequency ramp control circuit is configured to provide the fractional clock divider a set of divider ratios so that the frequency of the output clock signal is ramped in steps from a current frequency to a target frequency. The frequency ramp control circuit is configured to produce frequency change steps each having substantially the same duration. The frequency ramp control circuit is also configured to provide the set of divider ratios such as a first portion of the frequency ramp is performed using coarse frequency changes and a second portion of the ramp is performed using at least one fine frequency change.

8 Claims, 9 Drawing Sheets

(56) References Cited

U.S. PATENT DOCUMENTS

| | | |
|---|---|---|
| 9,214,943 B1 | 12/2015 | Gupta et al. |
| 9,246,478 B2 | 1/2016 | Luedeke et al. |
| 9,362,928 B1 | 6/2016 | Goyal et al. |
| 10,014,869 B1 | 7/2018 | Bowles et al. |
| 2007/0080724 A1 | 4/2007 | Wadhwa et al. |

OTHER PUBLICATIONS

Yoon J-H., et al., "A DC-to-12.5 Gb/s 9.76 Mw/Gb/s All-Rate CDR with a Single LC VCO in 90 nm CMOS," IEEE Journal of Solid-State Circuits, vol. 52 (3), Mar. 1, 2017, pp. 856-866, XP011641923, [retrieved on Feb. 27, 2017].

| M/N | OUTPUT CLOCK $f_{out}$ RISING EDGE POSITIONS | | | | | | | | | | |
|---|---|---|---|---|---|---|---|---|---|---|---|
| | 0 | 1 | 2 | 3 | 4 | 5 | 6 | 7 | 8 | 9 | 10 |
| 10/20 | 0 | 4 | 8 | 12 | 16 | 20 | 24 | 28 | 32 | 36 | mod 40 |
| 9/20 | 0 | 4 | 9 | 13 | 18 | 22 | 27 | 31 | 35 | mod 40 | |
| 8/20 | 0 | 5 | 10 | 15 | 20 | 25 | 30 | 35 | mod 40 | | |
| 7/20 | 0 | 6 | 11 | 17 | 23 | 29 | 34 | mod 40 | | | |
| 6/20 | 0 | 7 | 13 | 20 | 27 | 33 | mod 40 | | | | |
| 5/20 | 0 | 8 | 16 | 24 | 32 | mod 40 | | | | | |
| 4/20 | 0 | 10 | 20 | 30 | mod 40 | | | | | | |
| 3/20 | 0 | 13 | 27 | mod 40 | | | | | | | |
| 2/20 | 0 | 20 | mod 40 | | | | | | | | |
| 1/20 | 0 | mod 40 | | | | | | | | | |

FIG. 3A

| M/N | OUTPUT CLOCK $f_{out}$ FALLING EDGE POSITIONS | | | | | | | | | | |
|---|---|---|---|---|---|---|---|---|---|---|---|
| | 0.5 | 1.5 | 2.5 | 3.5 | 4.5 | 5.5 | 6.5 | 7.5 | 8.5 | 9.5 | 10.5 |
| 10/20 | 2 | 6 | 10 | 14 | 18 | 22 | 26 | 30 | 34 | 38 | mod 42 |
| 9/20 | 2 | 7 | 11 | 16 | 20 | 24 | 29 | 33 | 38 | mod 42 | |
| 8/20 | 2 | 8 | 13 | 18 | 23 | 28 | 33 | 38 | mod 42 | | |
| 7/20 | 2 | 9 | 14 | 20 | 26 | 31 | 37 | mod 42 | | | |
| 6/20 | 2 | 10 | 17 | 23 | 30 | 37 | mod 42 | | | | |
| 5/20 | 2 | 12 | 20 | 28 | 36 | mod 42 | | | | | |
| 4/20 | 2 | 15 | 25 | 35 | mod 42 | | | | | | |
| 3/20 | 2 | 20 | 33 | mod 42 | | | | | | | |
| 2/20 | 2 | 30 | mod 42 | | | | | | | | |
| 1/20 | 2 | mod 42 | | | | | | | | | |

M/N TABLE

| M\N | 1 | 2 | 3 | • | • | • | 20 | • | • | • | 40 |
|---|---|---|---|---|---|---|---|---|---|---|---|
| 20 | | | | • | • | • | | • | • | • | 0.500 |
| 19 | | | | | | | | | | | 0.475 |
| 18 | | | | | | | | | | | 0.450 |
| 17 | | | | | | | | | | | 0.425 |
| 16 | | | | | | | | | | | 0.400 |
| 15 | | | | | | | | | | | 0.375 |
| 14 | | | | | | | | | | | 0.350 |
| 13 | | | | | | | | | | | 0.325 |
| 12 | | | | | | | | | | | 0.300 |
| 11 | | | | | | | | | | | 0.275 |
| 10 | | | | • | • | • | 0.500 | • | • | • | 0.250 |
| 9 | | | | | | | 0.450 | | | | 0.225 |
| 8 | | | | | | | 0.400 | | | | 0.200 |
| 7 | | | | | | | 0.350 | | | | 0.175 |
| 6 | | | | | | | 0.300 | | | | 0.150 |
| 5 | | | | | | | 0.250 | | | | 0.125 |
| 4 | | | | | | | 0.200 | | | | 0.100 |
| 3 | | | | | | | 0.150 | | | | 0.075 |
| 2 | | | | | | | 0.100 | | | | 0.050 |
| 1 | | | | | | | 0.050 | | | | 0.025 |

M/N TABLE

| M\N | 1 | 2 | 3 | • | • | • | 20 | • | • | • | 40 |
|---|---|---|---|---|---|---|---|---|---|---|---|
| 20 | | | | • | • | • | 1.000 | • | • | • | 0.500 |
| 19 | | | | | | | 0.950 | | | | 0.475 |
| 18 | | | | | | | 0.900 | | | | 0.450 |
| 17 | | | | | | | 0.850 | | | | 0.425 |
| 16 | | | | | | | 0.800 | | | | 0.400 |
| 15 | | | | | | | 0.750 | | | | 0.375 |
| 14 | | | | | | | 0.700 | | | | 0.350 |
| 13 | | | | | | | 0.650 | | | | 0.325 |
| 12 | | | | | | | 0.600 | | | | 0.300 |
| 11 | | | | | | | 0.550 | | | | 0.275 |
| 10 | | | | • | • | • | 0.500 | • | • | • | 0.250 |
| 9 | | | | | | | 0.450 | | | | 0.225 |
| 8 | | | | | | | 0.400 | | | | 0.200 |
| 7 | | | | | | | 0.350 | | | | 0.175 |
| 6 | | | | | | | 0.300 | | | | 0.150 |
| 5 | | | | | | | 0.250 | | | | 0.125 |
| 4 | | | | | | | 0.200 | | | | 0.100 |
| 3 | | | | | | | 0.150 | | | | 0.075 |
| 2 | | | | | | | 0.100 | | | | 0.050 |
| 1 | | | | | | | 0.050 | | | | 0.025 |

FIG. 8A

M/N TABLE

| M\N | 1 | 2 | 3 | • | • | • | 20 | • | • | • | 40 |
|---|---|---|---|---|---|---|---|---|---|---|---|
| 20 | | | | • | • | • | 1.000 | • | • | • | 0.500 |
| 19 | | | | | | | 0.950 | | | | 0.475 |
| 18 | | | | | | | 0.900 | | | | 0.450 |
| 17 | | | | | | | 0.850 | | | | 0.425 |
| 16 | | | | | | | 0.800 | | | | 0.400 |
| 15 | | | | | | | 0.750 | | | | 0.375 |
| 14 | | | | | | | 0.700 | | | | 0.350 |
| 13 | | | | | | | 0.650 | | | | 0.325 |
| 12 | | | | | | | 0.600 | | | | 0.300 |
| 11 | | | | | | | 0.550 | | | | 0.275 |
| 10 | | | | • | • | • | 0.500 | • | • | • | 0.250 |
| 9 | | | | | | | 0.450 | | | | 0.225 |
| 8 | | | | | | | 0.400 | | | | 0.200 |
| 7 | | | | | | | 0.350 | | | | 0.175 |
| 6 | | | | | | | 0.300 | | | | 0.150 |
| 5 | | | | | | | 0.250 | | | | 0.125 |
| 4 | | | | | | | 0.200 | | | | 0.100 |
| 3 | | | | | | | 0.150 | | | | 0.075 |
| 2 | | | | | | | 0.100 | | | | 0.050 |
| 1 | | | | | | | 0.050 | | | | 0.025 |

FRACTIONAL CLOCK GENERATOR WITH RAMP CONTROL INCLUDING FIXED TIME INTERVAL AND COARSE/FINE FREQUENCY CHANGE STEPS

CROSS-REFERENCE TO RELATED APPLICATION

This application is a divisional and claims priority to the filing date of U.S. patent application Ser. No. 15/453,712, filed on Mar. 8, 2017, which is incorporated herein by reference.

BACKGROUND

Field

Aspects of the present disclosure relate generally to clock signal generators, and in particular, to a fractional clock signal generator with frequency ramp control characterized with fixed time interval and coarse/fine frequency change steps.

Background

A clock generator may be configured as a fractional clock divider. A fractional clock divider receives an input clock signal and generates therefrom an output clock signal with a frequency equal to a divider ratio multiplied by the frequency of the input clock signal. Often a fractional clock divider is used in applications where the frequency of the output clock signal is changed based on certain requirements.

If the output clock signal is applied to a core of an integrated circuit (IC), a change in the frequency of the output clock signal produces a change in the current supplied to the core. If the change in frequency is a large positive change, the current supplied to the core increases substantially. This may cause a relatively large voltage droop in a supply or rail voltage used by the core. The large voltage droop may cause malfunction or other adverse effects in the operation of the core.

Accordingly, to prevent or reduce the voltage droop produced in the rail voltage, the frequency of a clock signal supplied to the core is gradually changed in steps from a current frequency to a target frequency. This produces a small voltage droop per each frequency change step, wherein the small voltage droop is not likely to cause malfunction or other adverse effects in the operation of the core.

It is desirable for the frequency change steps to have substantially the same duration so that the corresponding current surge and voltage droops are sufficiently spaced apart so that the rail voltage may recover from each voltage droop. Further, it is desirable for the frequency change steps to be configured to produce a relatively fast frequency ramp from a current frequency to a target frequency and with high resolution in achieving the target frequency.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a fractional clock divider having a first counter configured to generate an index of edge positions of an input clock signal, and an output clock generator configured to generate an output clock signal based on a current divider ratio and the index; and a frequency ramp control circuit including a second counter configured to generate a first signal based on a selected duration for a frequency change step of the output clock signal, wherein the second counter is synchronized with the first counter, and a divider ratio determining device configured to determine the current divider ratio.

Another aspect of the disclosure relates to a method including generating an index of edge positions of an input clock signal; generating an output clock signal based on a current divider ratio and the index; generating a first signal based a selected duration for a frequency change step of the output clock signal; synchronizing the generation of the first signal with the index; and determining the current divider ratio.

Another aspect of the disclosure relates to an apparatus including a fractional clock divider configured to generate an output clock signal with frequencies pursuant to a frequency ramp from a current frequency to a target frequency based on a set of divider ratios multiplied by a frequency of an input clock signal, respectively; and a divider ratio determining device configured to generate the set of divider ratios including selecting a first set of same denominators for a first subset of the set of divider ratios, and selecting a second set of one or more same denominators for a second subset of the set of divider ratios.

Another aspect of the disclosure relates to a method including generating an output clock signal with frequencies pursuant to a frequency ramp from a current frequency to a target frequency based on a set of divider ratios multiplied by a frequency of an input clock signal, respectively; and generating the set of divider ratios including selecting a first set of same denominators for a first subset of the set of divider ratios, and selecting a second set of one or more same denominators for a second subset of the set of divider ratios.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A power delivery network (PDN) is often employed in an integrated circuit (IC) to supply power to one or more cores of the IC. Controlling the power supplied to an IC core typically involves providing a particular supply or rail voltage VDD and a clock signal with a particular frequency f. The amount of power consumed by the core is a function of the square of the rail voltage (e.g., $VDD^2$) and the frequency f of the clock signal.

The supplying of power to a core via a particular voltage-frequency pair is typically referred to in the relevant art as Dynamic Clock Voltage Scaling (DCVS) or Dynamic Voltage Frequency Scaling (DVFS) (referred to hereinafter as "DCVS"). A core may also be operated under a set of performance modes. For example, a particular core may be operated in a high performance mode (e.g., Turbo mode) when it is performing a demanding task (e.g., processing large amounts of data in a fast manner). The core may also be operated in a medium performance mode (e.g., Nominal mode) when it is performing a medium complexity level task (e.g., processing non-time-critical data). Similarly, the core may be operated in a low performance mode (e.g., Retention mode) when it is performing a minimal task (e.g., a memory core merely retaining data).

Correlated with the set of performance modes are a set of calibrated voltage-frequency pairs or DCVS levels for supplying appropriate power to the core based on the current power performance mode. For instance, if a core is being operated in a high power mode, a particular high-power DCVS level $VDD_1$-$f_1$ is supplied to the core; if the core is being operated in a medium power mode, a particular medium-power DCVS level $VDD_2$-$f_2$ is supplied to the core; and if the core is being operated in a low power mode, a particular low-power DCVS level $VDD_3$-$f_3$ is supplied to the core, wherein generally $VDD_1 > VDD_2 > VDD_3$ and $f_1 > f_2 > f_3$.

Figure 1A:
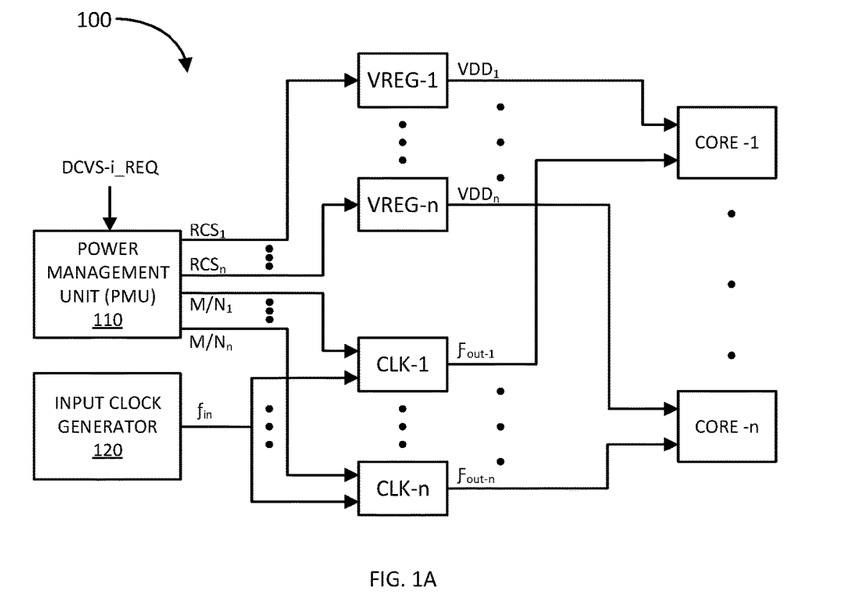
FIG. 1A illustrates a block diagram of an exemplary integrated circuit (IC) in accordance with an aspect of the disclosure.

FIG. 1A illustrates a block diagram of an exemplary integrated circuit (IC) 100 in accordance with an aspect of the disclosure. The IC 100 includes a power delivery network (PDN) for controlling the delivery of power in the form of specific DCVS levels to a set of cores. In particular, the IC 100 includes a power management unit (PMU), an input clock generator 120, a set of voltage regulators VREG-1 to VREG-n, a set of output clock generators CLK-1 to CLK-n, and a set of cores 1-n.

Figure 1B:
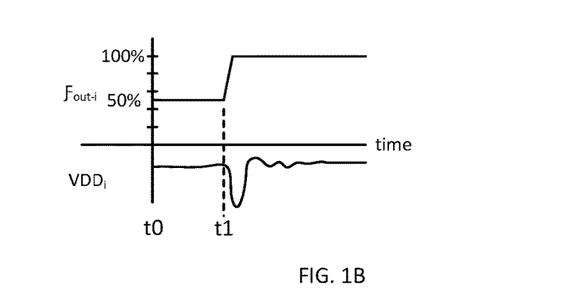
FIG. 1B illustrates a graph of an exemplary clock signal and associated rail voltage VDD supplied to a core in accordance with another aspect of the disclosure.
Figure 1C:
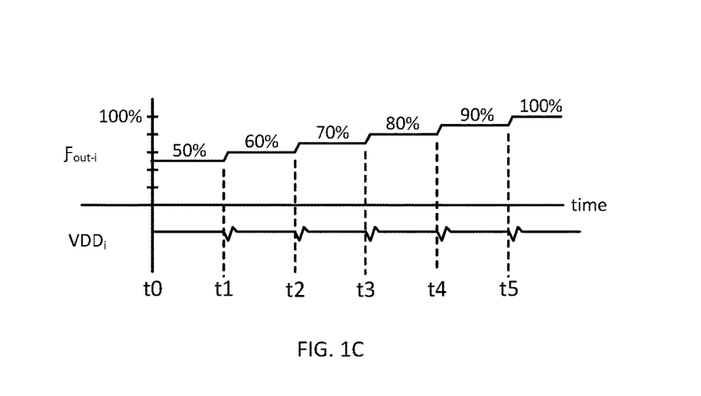
FIG. 1C illustrates a graph of another exemplary clock signal and associated rail voltage VDD supplied to a core in accordance with another aspect of the disclosure.

The PMU 110 is configured to receive DCVS requests (e.g., DCVS-i_REQ) for supplying power to the cores 1-n (e.g., the $i^{th}$ core). Based on DCVS requests, the PMU 110 generates regulator control signals $RCS_1$ to RCS and frequency control signals $M/N_1$ to $M/N_n$ to provide the requested power to the cores 1-n, respectively. The voltage regulators VREG-1 to VREG-n, in turn, generate rail voltages $VDD_1$ to VDD for the cores 1-n based on the control signals $RCS_1$ to $RCS_n$, respectively. Similarly, the output clock generators CLK-1 to CLK-n generate clock signals $f_{out-1}$ to $f_{out-n}$ based on frequency control signals $M/N_1$ to $M/N_n$ and an input clock signal $f_{in}$ generated by the input clock generator 120, respectively.

Each of the frequency control signals $M/N_1$ to $M/N_n$ is a divider ratio including an integer numerator M and an integer denominator N. The clock generators CLK-1 to CLK-n generate the output clock signals $f_{out-1}$ to $f_{out-n}$ f by dividing frequency of the input clock signal $f_{in}$ by the divider ratios $M/N_1$ to $M/N_n$, respectively. As discussed below with reference to FIGS. 1B-1C, each of the clock generators CLK-1 to CLK-n ramps the frequency of the output clock signal from its current frequency to a target frequency to reduce voltage droop in the corresponding rail voltage.

FIG. 1B illustrate an exemplary graph of an output clock signal $f_{out-i}$ generated by the $i^{th}$ clock generator CLK-i and an associated rail voltage $VDD_i$, generated by the $i^{th}$ voltage regulator REG-i versus time in accordance with another aspect of the disclosure. In this example, at time t0, the clock signal $f_{out-i}$ supplied to the $i^{th}$ core-i is at 50% of maximum frequency (e.g., $\frac{1}{2}*f_{in}$ of the input clock signal). Based on the DCVS change request, at time t1, the frequency of the clock signal $f_{out-i}$ is abruptly changed from 50% to 100% of maximum frequency. This causes the $i^{th}$ core to suddenly draw a large amount of current from the voltage regulator REG-i. As a result, the rail voltage $VDD_i$ experiences a substantial voltage droop at around time t1, which may cause malfunction or other adverse effects in the operation of the core-i.

FIG. 1C illustrate another exemplary graph of the output clock signal $f_{out-i}$ generated by the $i^{th}$ clock generator CLK-i and the associated rail voltage $VDD_i$ generated by the $i^{th}$ voltage regulator REG-i versus time in accordance with another aspect of the disclosure. In this example, at time t0, the clock signal $f_{out-i}$ supplied to the $i^{th}$ core-i is at 50% of maximum frequency. Based on a DCVS change request, instead of producing a substantial frequency change (e.g., from 50% to 100%) in a single step, the corresponding clock divider CLK-i generates a series of steps to ramp the frequency from 50% to 100%. This is done to reduce voltage droop in the rail voltage $VDD_i$ supplied to the core-i.

Based on a DCVS change request, at time t1, the frequency of the clock signal $f_{out-i}$ is stepped up from 50% to 60% of maximum frequency. This produces a small voltage droop in the rail voltage VDDi for the core-i. At time t2, the frequency of the clock signal $f_{out-i}$ is again stepped up from 60% to 70% of maximum frequency, which produces another small voltage droop in the rail voltage $VDD_i$. The process of stepping the frequency of the clock signal $f_{out-i}$ continues until reaching the target frequency of 100%; resulting in small voltage droops at times t3-t5. The small voltage drops prevents or reduces the likelihood of malfunction or other adverse effects in the operation of the corresponding core-i.

Figure 2:
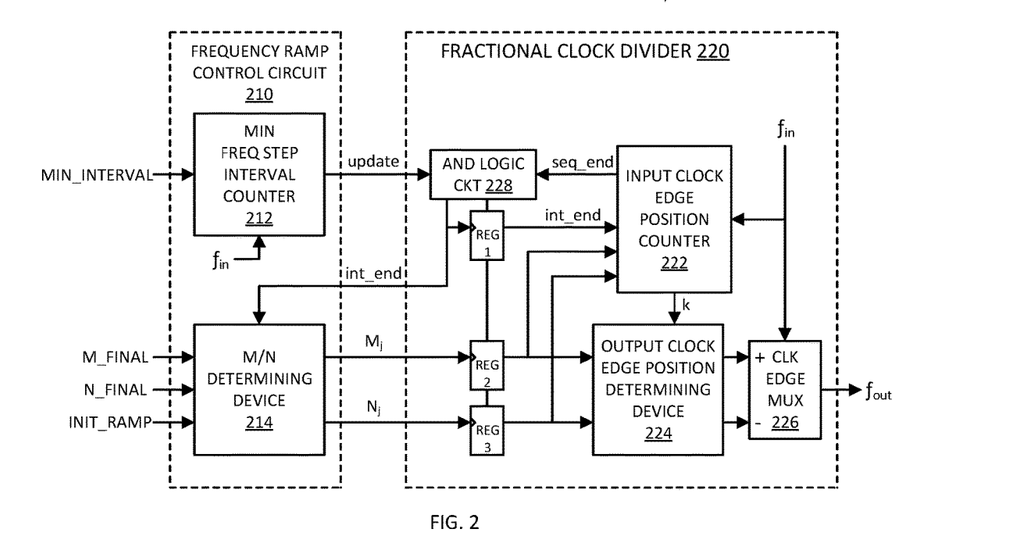
FIG. 2 illustrates a block diagram of an exemplary clock signal generator in accordance with another aspect of the disclosure.

FIG. 2 illustrates a block diagram of an exemplary clock signal generator 200 in accordance with another aspect of the disclosure. The clock signal generator 200 may be a detailed implementation of any of the clock signal generators CLK-1 to CLK-n previously discussed. The clock signal generator 200 includes a frequency ramp control circuit 210 and a fractional clock divider 220.

The frequency ramp control circuit 210, in turn, includes a minimum frequency step interval counter 212 and an M/N determining device 214. The minimum frequency step interval counter 212 is for setting a minimum duration for each frequency change step pursuant to a ramp of a current frequency to a target frequency of an output clock signal $f_{out}$. The counter 212 receives a MIN_INTERVAL signal indicating such duration in periods of an input clock signal $f_{in}$. The counter 212 is clocked by the input clock signal $f_{in}$. When a count generated by the counter 212 reaches the MIN_INTERVAL, the counter 212 asserts an update signal.

The M/N determining device 214 is configured to receive the final M and N values (M_Final and N_Final) and a ramp initiation signal INIT_RAMP, and generate a series of M and N values ($M_j$ and $N_{-j}$) for ramping the frequency of the output clock signal $f_{out}$ from a current frequency to a target frequency indicated by M_Final and N_Final. An asserted end-of-interval (int_end) signal initiates the M/N determining device 214 to generate another pair of $M_j$ and $N_{-j}$ values. The asserted int_end signal indicates an end (or a beginning) of a frequency change step.

The fractional clock divider 220 includes an input clock edge position counter 222, an output clock edge position determining device 224, a clock edge multiplexer 226, an AND logic circuit 228, and a set of registers REG-1, REG-2, and REG-3. The AND logic circuit 228 is configured to assert the intend signal in response to the update signal being asserted (meaning that the minimum step interval has been met) and an end-of-sequence (seq_end) signal being asserted. The input clock edge position counter 222 asserts the seq_end signal at an end of each repetition of a complete sequence of edge positions of the output clock signal $f_{out}$, as discussed further herein.

At an end of a frequency step interval, the AND logic circuit 228 causes the registers REG-1, REG-2, and REG-3 to output the int_end signal, the current divider ratio numerator $M_j$, and the current divider ratio denominator $N_j$. The int_end signal is applied to the input clock edge position counter 222 to inform it that it should output an input clock edge position index k and assert the seq_end signal based on the current values of $M_j$ and $N_j$. As mentioned, the current $M_j$ and $N_j$ values are applied to the input clock edge position counter 222, as well as to the output clock edge position determining device 224. Based on the current $M_j$ and $N_j$ values and the current input clock edge position index k, the output clock edge position determining device 224 instructs the clock edge multiplexer 226 to output either a positive edge (+) or negative edge (−) of the input clock signal $f_{in}$ to generate the output clock signal $f_{out}$. The input clock signal $f_{in}$ drives the input clock edge position counter 222.

The input clock edge position counter 222 is a modulo-2N counter. That is, the input clock edge position counter 222 increments the input clock edge position index k from zero (0) to 2N by one (1) for each edge of the input clock signal $f_{in}$. When the input clock edge position index k reaches 2N, the input clock edge position counter 222 causes the edge position index k to return to zero (0) in response to the next edge of the input clock signal $f_{in}$. So, if the current $N_j$ value is 20, the input clock edge position counter 222 increments k from 0 to 40 in steps of one (1), and then returns k to zero (0) upon receiving the next edge of the input clock signal $f_{in}$.

The input clock edge position counter 222 asserts the seq_end signal when the index k coincides with a zero (0) phase edge or at the end of a complete sequence of edges of the output clock signal $f_{in}$. Following a complete sequence, the sequence just repeats itself. A sequence of edges may reach zero (0) as few as k equal to four (4) for the case where $M_j/N_j=1/2$ (e.g., 10/20). For instance, in this case, the first rising edge of the output clock signal $f_{out}$ coincides with the k=0 edge of the input clock signal $f_{in}$. The first falling edge of the output clock signal $f_{out}$ coincides with the k=2 edge of the input clock signal $f_{in}$. Beginning with k=4, the sequence of edges repeats itself, where each edge of the output clock signal $f_{out}$ occurs every other edge of the input clock signal $f_{in}$ (e.g., at k=4, 6, 8, etc.). Thus, for the $M_j/N_j=10/20$ case, the seq_end signal is asserted at k=4, 8, 12, 16, 20, 24, 28, 32, 36, and mod 40 (or zero (0)).

Similarly, for $M_j/N_j=5/20$, a sequence of edges is completed at k=8 (phase zero (0)) and repeats thereafter. Thus, for this case, the seq_end signal is asserted at k=8, 16, 32, and mod 40 (or zero (0)). For other values of $M_j$ and $N_j$, the sequence of edges require 2N edges of the input clock signal $f_{in}$ to repeat itself (e.g., the only zero (0) phase occurs at k=2N). In such case, the seq_end signal is asserted every 2N edges of the input clock signal $f_{in}$. Thus, as described, the seq_end signal may be asserted as frequent as every k=4 edges and as infrequent as every k=2N edges. As discussed in more detail below, this variance produces unequal frequency change step durations, which may be undesirable.

Thus, to summarize the operation of the input clock edge position counter 222, the counter 222 receives the intend signal and the current $M_j$ and $N_j$ values from the output of the registers REG-1, REG-2 and REG-3 each time the intend signal is asserted. The intend signal informs the counter 222 to operate based on the new or current $M_j$ and $N_j$ values. The modulo for the counter 222 is set by the current $N_j$ value; the modulo being $2N_j$. As such, the counter 222 increments the input clock edge position index k from zero (0) to $N_j-1$ by one (1) for each edge of the input clock signal $f_{in}$, and then returns k to zero (0) in response to the next edge of the input clock signal $f_{in}$. The counter 222 also asserts the seq_end signal upon completion of a unique time sequence of edges of the output clock signal $f_{out}$ based on the $M_j$ and $N_j$ values.

The output clock edge position determining device 224 is configured to instruct the clock edge multiplexer 226 to either output a positive edge (+) or a negative edge (−) of the input clock signal $f_{in}$ to generate the output clock signal $f_{out}$ based on the current $M_j$ and $N_j$ values and the input clock edge position index k. The output clock edge position determining device 224 causes the clock edge multiplexer 226 to output a positive edge of the input clock signal $f_{in}$ by asserting a signal at the positive input (+) of the clock edge multiplexer 226 (as well as deasserting a signal at the negative input (−) of the clock edge multiplexer 226). Similarly, the output clock edge position determining device 224 causes the clock edge multiplexer 226 to output a negative edge of the input clock signal $f_{in}$ by asserting a signal at the negative input (−) of the clock edge multiplexer 226 (as well as deasserting a signal at the positive input (+) of the clock edge multiplexer 226).

Figure 3A:
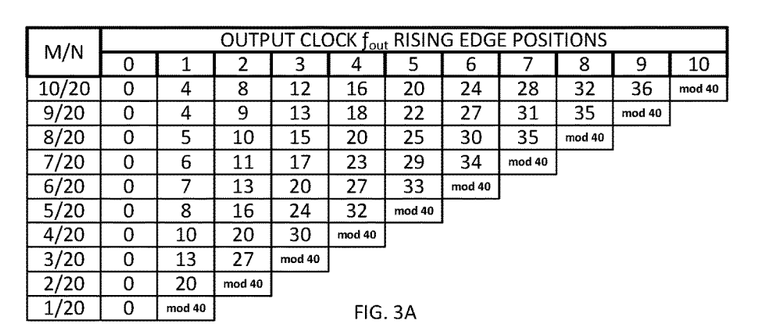
FIG. 3A illustrates a table depicting exemplary clock rising edge positions of an output clock signal relative to edge positions of an input clock signal in accordance with another aspect of the disclosure.

FIG. 3A illustrates a table depicting exemplary the rising edge positions $T_R(k)$ of the output clock signal $f_{out}$ relative to the input clock edge positions k for the case where $N_j=20$ in accordance with another aspect of the disclosure. The leftmost column header indicates the divider ratio M/N. Below the leftmost column header provides a series divider ratios (M/N), such as 10/20, 9/20, 8/20, and down to 1/20. The following column headers 0 to 10 indicate the index $T_R(k)$ of the edges of the output clock signal $f_{out}$, such as zero (0) being the first rising edge of the output clock signal $f_{out}$ and 10 being the 11$^{th}$ rising edge of the output clock signal $f_{out}$. Below the column headers 0 to 10 provides the corresponding input clock edge positions k of the input clock signal $f_{in}$.

Considering the case where $M_j/N_j$ is 10/20, the output clock edge position determining device 224 instructs the clock edge multiplexer 226 to output rising edges of the input clock signal $f_{in}$ such that the rising edges 0 to 10 of the output clock signal $f_{out}$ substantially coincides with edges k=0, 4, 8, 12, 16, 20, 24, 28, 32, 36, and mod 40 (or 0) of the input clock signal $f_{in}$. Considering next the case where M/N=5/20, the output clock edge position determining device 224 instructs the clock edge multiplexer 226 to output rising edges of the input clock signal $f_{in}$ such that the rising edges 0 to 5 of the output clock signal $f_{out}$ substantially coincides with edges k=0, 8, 16, 24, 32, and mod 40 (or 0) of the input clock signal $f_{in}$. The output clock edge position determining device 224 may include tables for instructing the clock edge multiplexer 226 to output positive clock edges of the input clock signal $f_{in}$ for all desired M and N values.

Figure 3B:
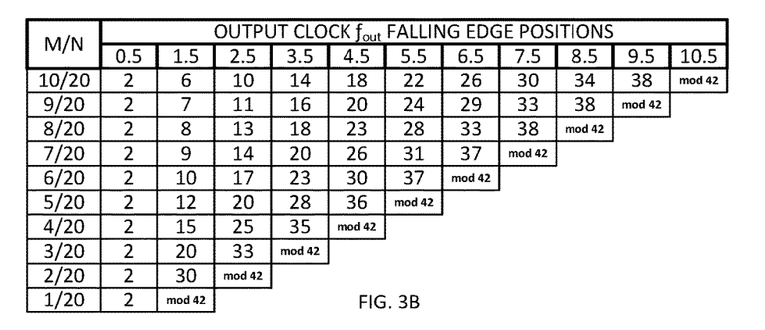
FIG. 3B illustrates a table depicting exemplary clock falling edge positions of an output clock signal relative to edge positions of an input clock signal in accordance with another aspect of the disclosure.

FIG. 3B illustrates a table depicting exemplary falling edge positions $T_F(k)$ of the output clock signal $f_{out}$ relative to the input clock edge positions k for the case where N=20 in accordance with another aspect of the disclosure. Similarly, the leftmost column header indicates a divider ratio M/N. Below the leftmost column header provides a series of divider ratios (M/N), such as 10/20, 9/20, 8/20, and down to 1/20. The following column headers 0.5 to 10.5 indicate the index $T_F(k)$ of the falling edges of the output clock signal $f_{out}$, such as zero (0.5) being the first falling edge of the output clock signal $f_{out}$ and 10.5 being the 11$^{th}$ falling edge of the output clock signal $f_{out}$. The indices $T_F(k)$ of the falling edges are indicated with a resolution of 0.5 because they are situated between rising edges of the output clock signal $f_{out}$. As an example, the 0.5 falling edge occurs between the zero (0) and one (10 rising edges of the output clock signal $f_{out}$. Below the column headers 0.5 to 10.5 provides the corresponding input clock edge index k of the input clock signal $f_{in}$.

Considering again the case where $M_j/N_j$ is 10/20, the output clock edge position determining device 224 instructs the clock edge multiplexer 226 to output falling edges of the input clock signal $f_{in}$ such that falling edges 0.5 to 10.5 of the output clock signal $f_{out}$ substantially coincides with edges k=2, 6, 10, 14, 18, 22, 26, 30, 34, 38, and mod 42 (or 2) of the input clock signal $f_{in}$ Considering next the case where $M_j/N_j=5/20$, the output clock edge position determining device 224 instructs the clock edge multiplexer 226 to output falling edges of the input clock signal $f_{in}$ such that the falling edges 0.5 to 5.5 of the output clock signal $f_{out}$ substantially coincides with edges k=0, 12, 20, 28, 36, and mod 42 (or 2) of the input clock signal $f_{in}$. The output clock edge position determining device 224 may include tables for instructing the clock edge multiplexer 226 to output negative clock edge of the input clock signal $f_{in}$ for all desired M and N values.

Instead of using tables, the output clock edge position determining device 224 may determine the rising edge index $T_R(k)$ of the output clock signal $f_{out}$ in terms of the edge index k of the input clock signal $f_{in}$ in accordance with the following relationship:

$$T_R(k)=\text{round}\{2k(N/M)\}$$

Similarly, the output clock edge position determining device 224 may determine the falling edge index $T_F(k)$ of the output clock signal $f_{out}$ in terms of the edge index k of the input clock signal $f_{in}$ in accordance with the following relationship:

$$T_F(k)=\text{round}\{2k(N/M)\}+2$$

Where the round{ } operation rounds the number inside the brackets to the nearest integer.

As mentioned above, a problem with the clock signal generator 200 is that it produces frequency change steps having unequal or varying durations. The problem stems from the fact that the assertion of the seq_end signal varies with the current values of $M_j$ and $N_j$ and the counters 212 and 222 are free running and not synchronized with each other. The end of a frequency change step occurs when the update and seq_end signals are both asserted. However, because both counters 212 and 222 are free running, these two signals are not asserted at the same time. As explained below with reference to FIGS. 4A-4B, this causes the clock signal generator 200 to produce frequency change steps of varying durations.

Figure 4A:
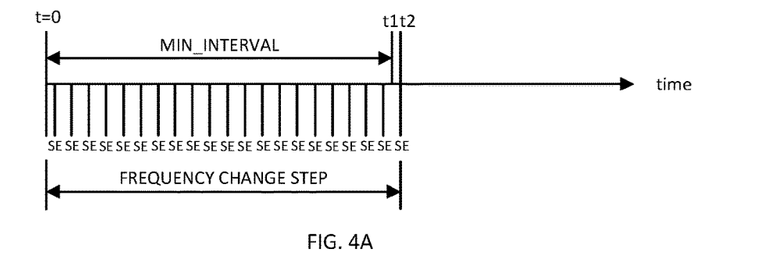
FIG. 4A illustrates a graph of exemplary signals that define a duration of a frequency step interval in the clock signal generator of FIG. 2 in accordance with another aspect of the disclosure.

FIG. 4A illustrates a graph of exemplary signals that define a duration of a frequency step in accordance with another aspect of the disclosure. In this example, the seq_end signal (further abbreviated in FIGS. 4A-4B as "SE") occurs often, such as every fourth edge of the input clock signal $f_{in}$ as in the case where $M_j/N_j$ is equal to 10/20. Further, in accordance with this example, the MIN_INTERVAL is set to be approximately 4N or 80 edges of the input clock signal $f_{in}$. Additionally, in this example, the input clock edge position counter 222 begins two edges earlier than the minimum frequency step interval counter 212 as these counters are not synchronized.

As illustrated, the update signal generated by the counter 212 gets asserted at time t1. The seq_end (SE) signal gets asserted at time t2. As previously discussed, the AND logic circuit 228 asserts the intend signal when both the update signal and the seq_end (SE) signal are asserted. In the graph, this occurs at substantially time t2. Thus, per this example, the duration of the frequency change step is approximately t2 (t2−0). As the seq_end (SE) signal is asserted every fourth edge of the input clock signal $f_{in}$ for $M_j/N_j$=10/20, the difference between the assertion of the update signal and the seq_end (SE) signal is at most four (4) edges of the input clock signal $f_{in}$.

Figure 4B:
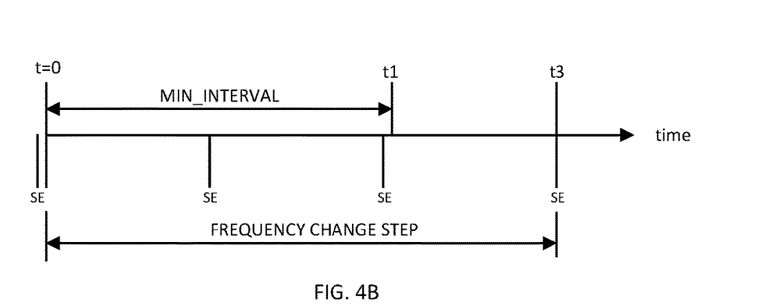
FIG. 4B illustrates a graph of another exemplary signals that define a duration of a frequency step interval in the clock signal generator of FIG. 2 in accordance with another aspect of the disclosure.

FIG. 4B illustrates a graph of another exemplary signals that define a duration of a frequency change step in accordance with another aspect of the disclosure. In this example, the seq_end (SE) signal occurs less often, such as every 2N or 40$^{th}$ edge of the input clock signal $f_{in}$ as in the case where $M_j/N_j$ is equal to 1/20. Similarly, the MIN_INTERVAL is set to be approximately 4N or 80 edges of the input clock signal $f_{in}$. Additionally, in this example, the input clock edge position counter 222 begins two edges earlier than the frequency step interval counter 212 as these counters are not synchronized.

Similar to the graph of FIG. 4A, the update signal generated by the counter 212 gets asserted at time t1. The seq_end (SE) signal gets asserted at time t3. As previously discussed, the AND logic circuit 228 asserts the intend signal when both the update signal and the seq_end (SE) signal are asserted. In the graph, this occurs at substantially time t3. Thus, per this example, the duration of the frequency change step is approximately t3 (t3−0). As the seq_end (SE) signal is asserted every 40$^{th}$ edge of the input clock signal $f_{in}$ for $M_j/N_j$=1/20, the difference between the assertion of the update signal and the seq_end (SE) signal is at most 40 edges of the input clock signal $f_{in}$.

The aforementioned graphs illustrate that the duration of the frequency change interval or step varies because the seq_end signal is asserted at different times based on the values of $M_j$ and $N_j$, and the two counters 212 and 222 are free running and not synchronized with each other. If the MIN_INTERVAL is set to be relatively large (e.g., 100*$N_j$), then the percent difference in the durations of the frequency change steps of FIGS. 4A-4B is relatively small and may be acceptable. However, if the MIN-INTERVAL is relatively small (in order to speed up the frequency ramping time of the output clock signal $f_{out}$, then the percent difference in the durations is relatively large and may have adverse consequences as voltage droops are not uniformly distributed in time.

Another problem with the clock signal generator 200 concerns the M/N determining device 214. The M/N determining device 214 employs a Manhattan algorithm to select $M_j$ and $N_j$ values. In a Manhattan algorithm, the M/N determining device 214 changes either $M_j$ or $N_j$ by one (1) to generate the next $M_{j+1}$ and $N_{j+1}$ values. That is, the following relationship applies:

$$M\_INT_{j+1}=M\_INT_j+(or\ -)1\ and\ N\_INT_{j+1}=N\_INT_j$$

or $$M\_INT_{j+1}=M\_INT_j\ and\ N\_INT_{j+1}=N\_INT_j+(or\ -)1$$

Because of the aforementioned restrictions, if a relatively high frequency resolution is desired to achieve a precise target frequency (e.g., each frequency change being five (5) percent of maximum frequency), then a relatively high N (e.g., N=40) needs to be selected. However, choosing a relatively high N requires a relatively long duration to ramp the current frequency to a target frequency. As a comparison, ramping the current frequency to a target frequency with N=40 requires four (4) times the duration required for ramping the current frequency to the target frequency using N=20. The corollary is that choosing a relatively low resolution (e.g., N=20, where each frequency change is 10 percent of maximum frequency) produces faster frequency ramp at the expense of frequency precision. This is better explained with reference to the following example.

Figure 5:
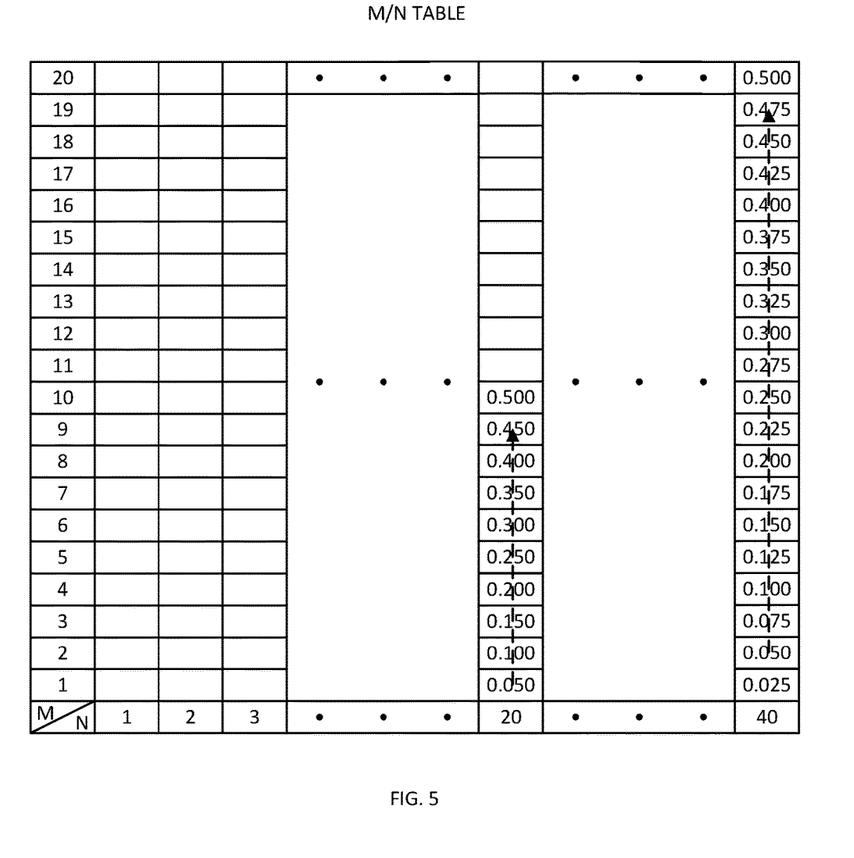
FIG. 5 illustrates a table of divider ratios (M/N) and exemplary frequency ramp profile in accordance with another aspect of the disclosure.

FIG. 5 illustrates a table of divider ratios (M/N) and exemplary frequency ramp profile in accordance with another aspect of the disclosure. The leftmost column includes incrementing M values from 1 to 20 from the bottom row to the top row of the table. The bottom row includes incrementing N values from 1 to 40 from the leftmost column to the rightmost column of the table. The divider ratios are noted for various M values for N=20 and N=40 columns.

In both of examples described below, the current frequency of the output clock signal $f_{out}$ is 1/20*frequency of the input clock signal $f_{in}$. In the first example, the target frequency for the output clock signal $f_{out}$ is 9/20 the frequency of the input clock signal $f_{in}$. In such case, the M/N determining device 214 chooses N=20 because that resolution is sufficient to achieve the target frequency of 9/20*frequency of the input clock signal $f_{in}$. Thus, as indicated by the frequency ramp profile (dashed arrow along the N=20), the M/N determining device 214 begins at M/N=1/20 and increments M by one (1) for each frequency change step until it reaches M/N=9/20.

In the second example, the target frequency for the output clock signal $f_{out}$ is 19/40*frequency of the input clock signal $f_{in}$. In such case, the M/N determining device 214 chooses N=40 because that resolution is required to achieve the target frequency of 19/40*frequency of the input clock signal $f_{in}$. Thus, as indicated by the frequency ramp profile (dashed arrow along the N=40), the M/N determining device 214 begins at M/N=1/40 and increments M by one (1) for each frequency change step until it reaches M/N=19/40.

The problem with the higher resolution frequency ramp profile at N=40 is that the duration of the frequency ramp from the current frequency to the target frequency takes four (4) times longer than the frequency ramp at the lower resolution N=20. This is because there are twice as many frequency change steps in N=40 than in N=20, and each step in N=40 takes twice as long as each step in N=20. Thus, there is a need for an improved algorithm to produce a frequency ramp profile that can achieve target frequencies at high resolution (e.g., at N=40) at lower resolution speeds (e.g., at N=20 speed).

Figure 6:
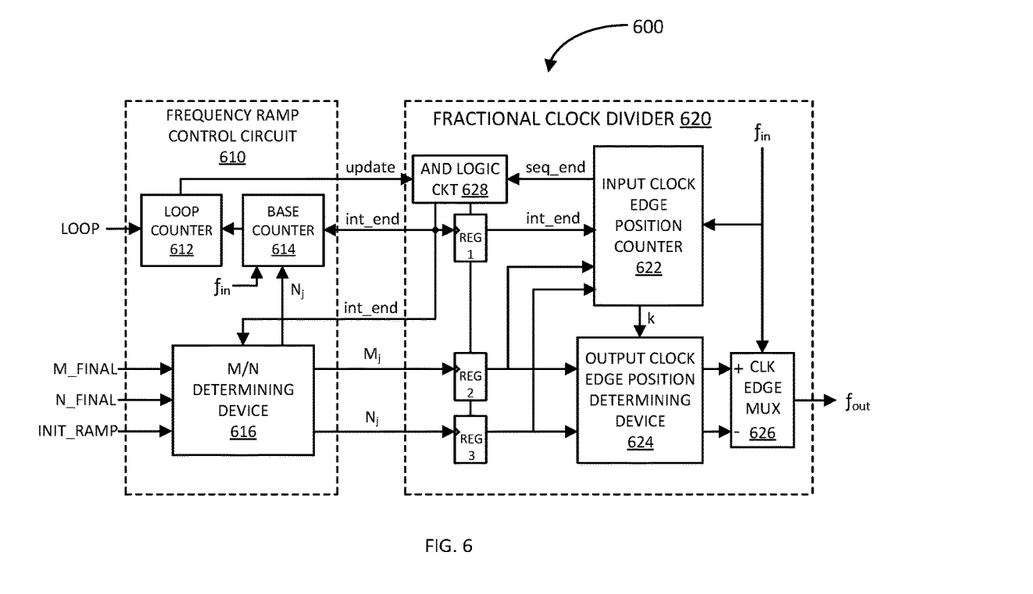
FIG. 6 illustrates a block diagram of another exemplary clock signal generator in accordance with another aspect of the disclosure.

FIG. 6 illustrates a block diagram of an exemplary clock signal generator 600 in accordance with another aspect of the disclosure. In summary, the clock signal generator 600 is configured to produce substantially equal duration frequency change intervals or steps. It accomplishes this by synchronizing a counter for determining the duration of each frequency change step and the counter used to generate the clock input edge position index k. Because of such synchronization, the update signal is asserted at substantially the same time as the end-of-sequence (seq_end) signal, which produces equal duration frequency change intervals.

Secondly, the clock signal generator 600 includes an M/N determining device that selects a set of divider ratios that achieves a fast frequency ramp with high resolution target frequency acquisition. In particularly, the M/N determining device chooses divider ratios to perform coarse frequency change steps (e.g., at N=20 resolution) for a first portion of a transition from a current frequency to a target frequency, and then chooses divider ratios to perform fine frequency change steps (e.g., at N=40 resolution) for a second portion (or remaining) portion of the transition from the current frequency to the target frequency. So that fast frequency ramping is achieved, the length of the first portion may be larger (e.g., 90% of the entire transition) than the second portion (e.g., 10% of the entire transition).

More specifically, the clock signal generator 600 includes a frequency ramp control circuit 610 and a fractional clock divider 620. The frequency ramp control circuit 610 includes a loop counter 612, a base counter 614, and an M/N determining device 616. The fractional clock divider 620 includes an AND logic circuit 628, registers REG-1, REG-2, and REG-3, an input clock edge position counter 622, an output clock edge position determining device 624, and a clock edge multiplexer 626.

The base counter 614 and loop counter 612 are configured to set the duration of each frequency change interval or step. The base counter 614 is primed (e.g., count reset to zero (0)) by an asserted the end-of-interval (int_end) signal. As the intend signal is asserted based on an asserted end-of-sequence (seq_end) signal, this effectively synchronizes the base counter 614 and the input clock edge position counter 622. Additionally, the current $N_j$ value is provided to the base counter 614 by the M/N search algorithm 616. The current $N_j$ value serves as the modulo for the base counter 614. Because the current $N_j$ also serves as the modulo for the input clock edge position counter 622, the output of the base counter 614 is synchronized with the seq_end signal asserted by the input clock edge position counter 622. Further, the base counter 614 is driven by the input clock signal $f_{in}$, which also drives the input clock edge position counter 622, further ensuring that the base/loop counters 614/612 are synchronized with the input clock edge position counter 622.

The loop counter 612 receives the output of the base counter 614 and also a loop signal, which sets a duration of the current frequency change step. The output of the base counter 614 triggers a count increment in the loop counter 612. The loop signal serves as the modulo for the loop counter 612. Thus, the loop counter 612 asserts an update signal every LOOP×$N_j$. Again, as the base counter 614 is primed by the int_end signal, which is asserted when the AND logic circuit 628 determines that both the update signal and the seq_end signal are asserted, the loop counter 612 asserts the update signal at substantially the same time as the input clock edge position counter 622 asserts the seq_end signal. As a result, each frequency change interval or step has a duration given by LOOP×$N_j$.

Figure 7:
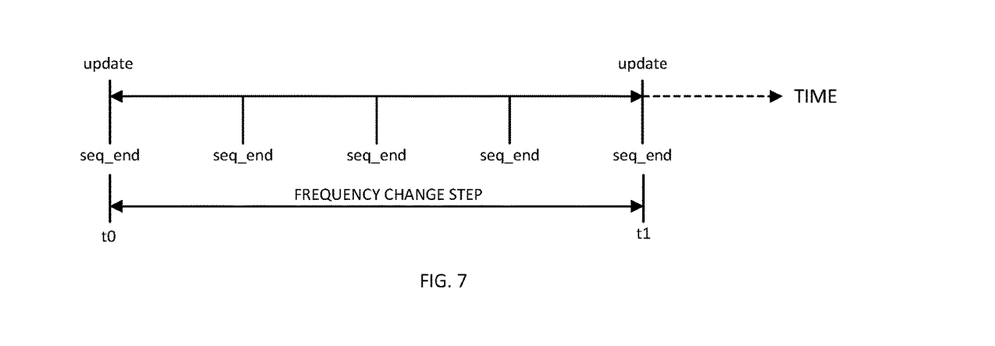
FIG. 7 illustrates a graph of exemplary signals that define duration of a frequency step interval in the clock signal generator of FIG. 6 in accordance with another aspect of the disclosure.

FIG. 7 illustrates a graph of exemplary signals that define a duration of a frequency change interval or step in the clock generator 600 accordance with another aspect of the disclosure. As illustrated, at time t0, both the update and seq_end signals are asserted. This causes the AND logic CIRCUIT 628 to assert the intend signal, which primes the base counter 614 and marks the beginning of a frequency change step.

At time t1, both the update and seq_end signals are asserted, causing the AND logic circuit 628 to assert the intend signal. The asserted int_end signal again primes the base counter 614, and marks the beginning of the next frequency change interval or step. In this example, the seq_end signal is asserted four (4) times during the frequency change step. This may be the case where the seq_end is asserted every N periods of the input frequency signal $f_{in}$ and the LOOP signal is set to four (4). Or, it may be the case where the seq_end is asserted every N/2 periods of the input frequency signal $f_{in}$ and the LOOP signal is set to two (2). Or, it may be the case where the seq_end is asserted every N/4 periods of the input frequency signal $f_{in}$ and the LOOP signal is set to one (1).

Similar to the M/N determining device 214 previously discussed, the M/N determining device 616 receives the M_FINAL and N_FINAL values associated with the target frequency, and a ramp initiation (INIT_RAMP) signal. The M/N determining device 616 generates the $M_0$ and $N_0$ associated with the current frequency. And, the M/N determining device 616 performs a search algorithm to determine the other values of $M_j$ and $N_j$ associated with the intermediate frequencies pursuant to the frequency ramp from the current frequency to the target frequency. The asserted int_end signal initiates the M/N determining device 616 to output the $M_M$ and $N_j$ values for the fractional clock generator 620.

The M/N determining device 616 differs from M/N search algorithm 214 in that the current $N_j$ value is provided to the base counter 614 to set the modulo thereof, as previously discussed. Further, the M/N determining device 616 uses a combination of at least two different N values to generate the frequencies pursuant to the frequency ramp. In particular, the M/N determining device 614 uses a lower N (e.g., N=20) for coarse frequency change steps for a first portion of the frequency ramp from the current frequency to the target frequency. The M/N determining device 614 uses a higher N (e.g., N=40) for fine frequency change steps for a second portion of the frequency ramp from the current frequency to the target frequency. This is better explained with reference to the following examples.

Figure 8A:
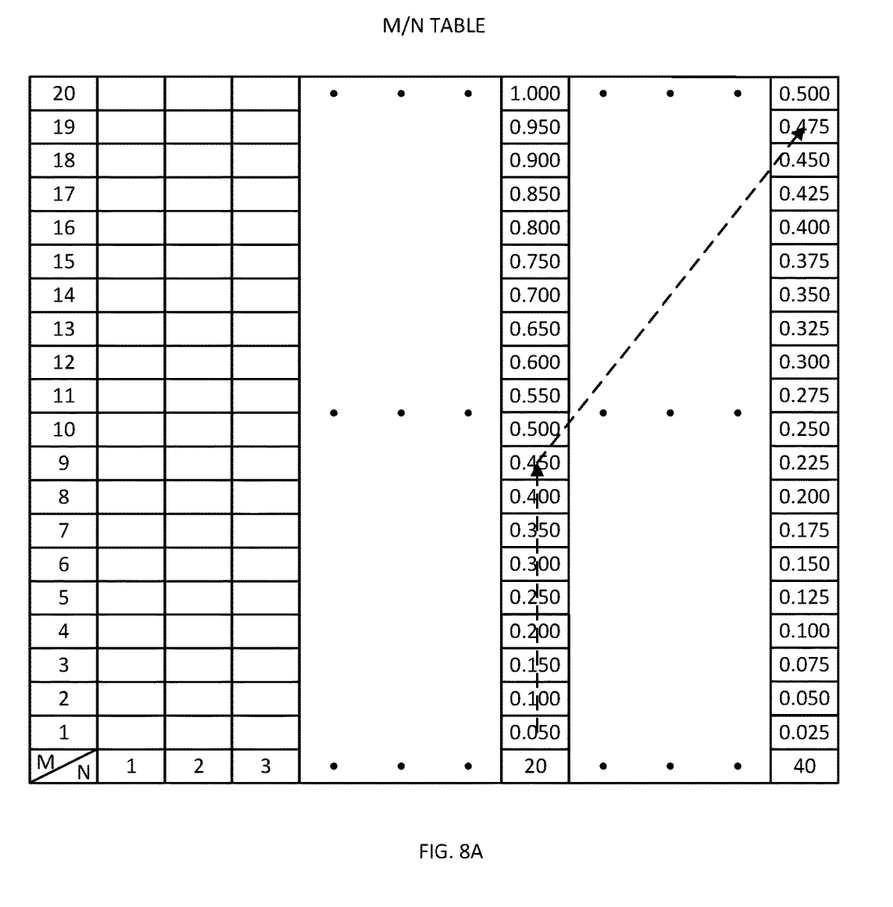
FIG. 8A illustrates a table of divider ratios (M/N) and an exemplary frequency ramp profile in accordance with another aspect of the disclosure.

FIG. 8A illustrates a table of divider ratios (M/N) and an exemplary frequency ramp profile in accordance with another aspect of the disclosure. Similar to the table of FIG. 5, the leftmost column includes incrementing M values from 1 to 20 from the bottom row to the top row of the table. The bottom row includes incrementing N values from 1 to 40 from the leftmost column to the rightmost column of the table. The divider ratios (M/N) are noted for various M values for N=20 and N=40 columns.

In this example, the current or start frequency of the output clock signal $f_{out}$ is at 1/20*$f_{in}$ of the input clock signal $f_{in}$. The target frequency for the output clock signal $f_{out}$ is 19/40*$f_{in}$ of the input clock signal $f_{in}$. Because of target frequency resolution is 1/40, the M/N determining device 614 may choose N=40 to step the frequency from the current frequency to the target frequency. However, the frequency ramp time with N=40 is four (4) times longer than it would be at N=20.

Instead, in this example, the M/N determining device 616 initially chooses N=20, with M=1 for the start or current of the output clock signal $f_{out}$, as indicated by the beginning of the frequency ramp profile (dashed arrow line along column N=20). The M/N determining device 616 increments M by one (1) for each frequency change step until it reaches M=9 or M/N=9/20, as indicated by the end of the first portion of the frequency ramp profile. At M/N=9/20, the frequency of the output clock signal $f_{out}$ is about 90 percent of the target frequency at M/N=19/40. Next, the M/N determining device 616 chooses N=40 and sets M to 19 to achieve the target frequency for the output clock frequency $f_{out}$ of 19/40*$f_{in}$, as indicated by the second portion of the frequency ramp profile (the dashed arrow line extending from M/N=9/20 to 19/20).

Thus, as illustrated, the M/N determining device 616 performs frequency change steps along the N=20 column or coarse frequency resolution (e.g., each step is a 10% frequency change at the frequency of the input clock signal $f_{in}$)

to achieve a first portion of the frequency ramp from the current frequency at $1/20*f_{in}$ to an intermediate frequency $9/20*f_{in}$. This produces relatively fast frequency ramping as there are half as many steps required to perform the same transition using N=40, and each step using N=20 has a duration half that of each step using N=40. When the intermediate frequency reaches a certain percentage of the target frequency (e.g., about 5%), the M/N determining device 616 changes to N=40 to complete the transition to the target frequency at the higher resolution frequency step. Thus, this algorithm provides for fast ramping time and high resolution in achieving the target frequency.

Figure 8B:
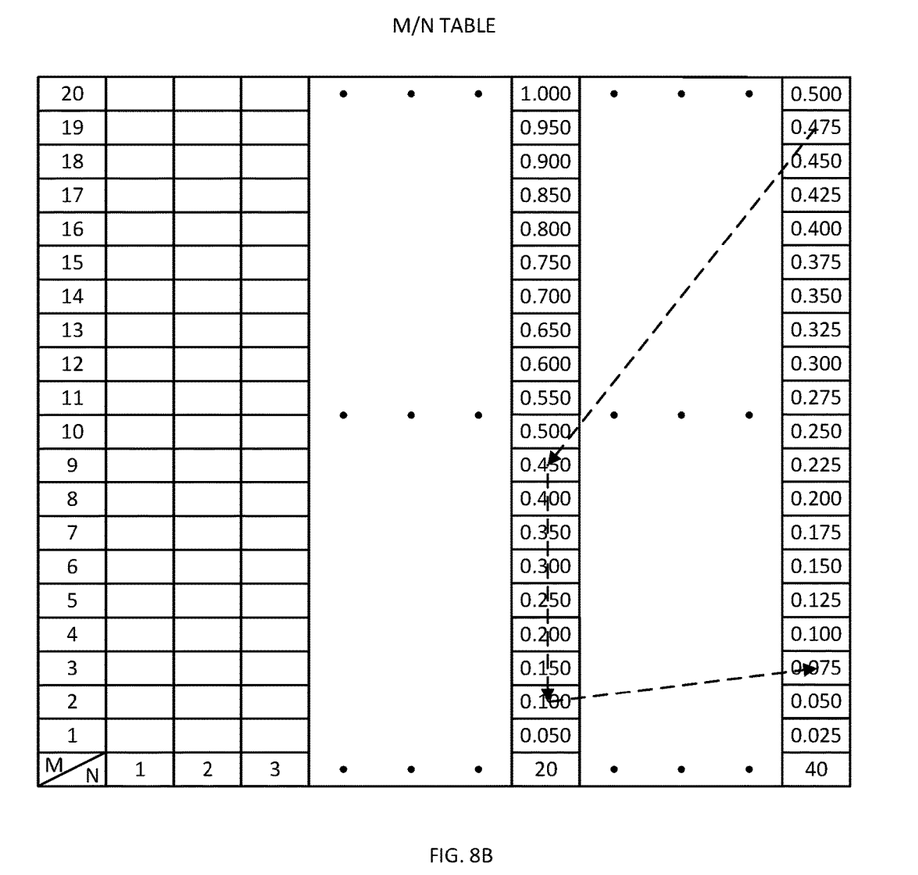
FIG. 8B illustrates a table of divider ratios (M/N) and another exemplary frequency ramp profile in accordance with another aspect of the disclosure.

FIG. 8B illustrates a table of divider ratios (M/N) and another exemplary frequency ramp profile in accordance with another aspect of the disclosure. This figure provides another example of the algorithm performed by the M/N determining device 616 to ramp the frequency of the output clock signal $f_{out}$ from a current frequency to a target frequency. In this example, the frequency ramp has a negative slope, i.e., the current frequency is greater than the target frequency. Further, in accordance with this example, the current frequency of the output clock signal $f_{out}$ is $19/40*f_{in}$ and the target frequency of the output clock signal $f_{out}$ is $3/40*f_{in}$.

For this frequency ramp, the M/N determining device 616 initially chooses N=20, with a first $M_1$ value of nine (9) to achieve a first portion of the frequency ramp profile as indicated by the diagonal dashed arrow line beginning with M/N=19/40 and ending with M/N=9/20. The M/N determining device 616 then decrements M by one (1) for each frequency change step until it reaches M=2 or M/N=2/20 to achieve the second portion of the frequency ramp profile, as indicated by the vertical dashed arrow line along column N=20. At M/N=2/20, the frequency of the output clock signal $f_{out}$ is about 90 percent of the target frequency at M/N=3/40. Next, the M/N determining device 616 chooses N=40 and sets M to 3 to achieve the target frequency for the output clock frequency $f_{out}$ of $3/40*f$ via a third portion of the frequency ramp profile as indicated by the dashed arrow line extending from M/N=2/20 to 3/40.

Similarly, the M/N determining device 616 performs frequency change steps along the N=20 column or coarse resolution (e.g., each step is 10% change of the frequency of the input clock signal $f_{in}$) to achieve a portion of the transmission from the current frequency at $19/40*f_{in}$ to an intermediate frequency $3/20*f_{in}$. This produces relatively fast frequency ramping as there are half as many steps required to perform the same transition using N=40, and each step using N=20 has a duration half that of each step using N=40. When the intermediate frequency reaches a certain percentage of the target frequency (e.g., about 5%), the M/N determining device 616 changes to N=40 to complete the transition to the target frequency at the higher resolution frequency step. Thus, this algorithm provides for fast ramping time and high resolution in achieving the target frequency.

Referring again to FIG. 6, the remaining components of the clock signal generator 600 operate similar to the corresponding components of the clock signal generator 200 previously discussed. In summary, the AND logic circuit 628 is configured to assert the intend signal (indicating an end of a previous frequency change step and/or the beginning of the next frequency change step) in response to both the update and the seq_end signals being asserted. The AND logic circuit 628 also causes the registers REG-1, REG-2, and REG-3 to output the int_end signal and the current $M_j$ and $N_j$ values.

The input clock edge position counter 622 is configured to output an input clock edge position index k based on the current $N_j$, which sets the modulo for the counter 622. The input clock edge position counter 622 is also configured to or assert the seq_end signal at the end of a complete sequence of edges or at a zero (0) phase edge. The intend signal informs the input clock edge position counter 622 that it has new $M_j$ and $N_j$ values upon which to generate the input clock edge position index k and assert the seq_end signal. Further, the input clock edge position counter 622 is driven by the input clock signal $f_{in}$.

The output clock edge position determining 624 is configured to instruct the clock edge multiplexer 626 to output either a positive or negative edge of the input clock signal $f_{in}$ based on the input clock edge position index k and the current $M_j$ and $N_j$ values to generate an output clock signal $f_{out}$ with frequency $M_j/N_j*f_{in}$. Based on the instruction received from the output clock edge position determining 624, the clock edge multiplexer 626 outputs either a positive edge or a negative edge of the input clock signal $f_{in}$ to generate the output clock signal $f_{out}$.

Figure 9:
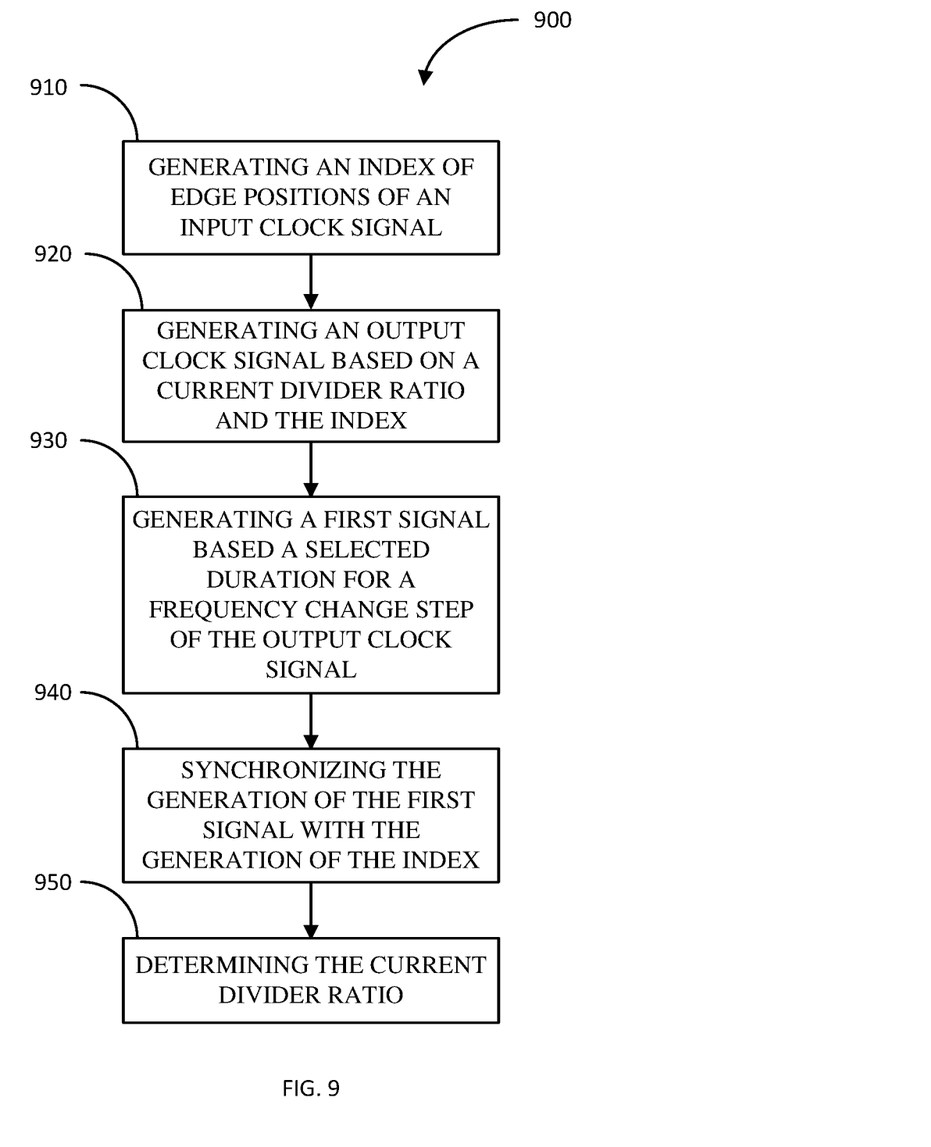
FIG. 9 illustrates a flow diagram of an exemplary method of generating a clock signal in accordance with another aspect of the disclosure.

FIG. 9 illustrates a flow diagram of an exemplary method 900 of generating a clock signal in accordance with another aspect of the disclosure.

The method 900 includes generating an index of edge positions of an input clock signal (block 910). An example of a means for generating an index of edge positions of an input clock signal includes any of the edge position counters 222 and 622 described herein.

The method 900 further includes generating an output clock signal based on a current divider ratio and the index (block 920). An example of a means for generating an output clock signal based on a current divider ratio and the index includes any of the clock edge state machines 224 and 624 and clock edge multiplexers 226 and 626 described herein.

The method 900 further includes generating a first signal based a selected duration for a frequency change step of the output clock signal (block 930). An example of a means for generating a first signal based a selected duration for a frequency change step of the output clock signal includes the base and loop counters 612 and 614.

The method 900 further includes synchronizing the generation of the first signal with generation of the index (block 940). An example of a means for synchronizing the generation of the first signal with the generation of the index includes the AND logic circuit 628 generating the intend signal for priming the base counter 614 and using the current $N_j$ value as the modulo for the base counter 614.

The method 900 further includes determining the current divider ratio (block 950). An example of determining the current divider ratio includes any of the M/N determining devices 214 and 616 described herein.

Figure 10:
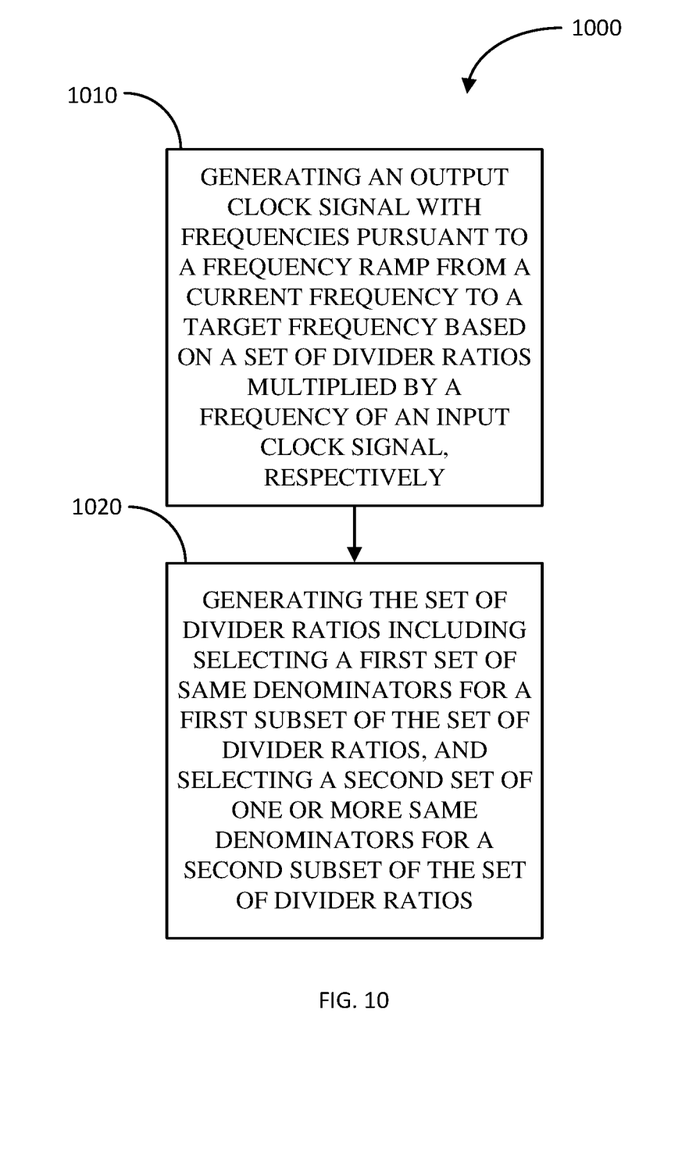
FIG. 10 illustrates a flow diagram of another exemplary method of generating a clock signal in accordance with another aspect of the disclosure.

FIG. 10 illustrates a flow diagram of another exemplary method 1000 of generating a clock signal in accordance with another aspect of the disclosure.

The method 1000 includes generating an output clock signal with frequencies pursuant to a frequency ramp from a current frequency to a target frequency based on a set of divider ratios multiplied by a frequency of an input clock signal, respectively (block 1010). An example of a means for generating an output clock signal with frequencies pursuant to a frequency ramp from a current frequency to a target frequency based on a set of divider ratios multiplied by a frequency of an input clock signal, respectively, includes any of the fractional clock dividers 220 and 620 described herein.

The method 1010 further includes generating the set of divider ratios including selecting a first set of same denominators for a first subset of the set of divider ratios, and selecting a second set of one or more same denominators for a second subset of the set of divider ratios (block 1020). An example of a means for generating the set of divider ratios including selecting a first set of same denominators for a first subset of the set of divider ratios, and selecting a second set of one or more same denominators for a second subset of the set of divider ratios includes the M/N determining device 616 described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method, comprising:
   generating an index of edge positions of an input clock signal;
   generating an output clock signal based on a current divider ratio and the index;
   generating a first signal based on a selected duration for a frequency change step of the output clock signal;
   synchronizing the generation of the first signal with the generation of the index, wherein synchronizing the generation of the first signal with the generation of the index, comprises:
   generating a second signal indicating an end of a sequence of edges of the output clock signal at substantially the same time as the generation of the index; and
   generating the first signal based on the second signal;
   generating a fourth signal indicating the end of the frequency change step based on the first and second signals; and
   determining the current divider ratio.

2. The method of claim 1, wherein generating the first signal comprises generating a count based on a modulo set by the current divider ratio and initiated by the fourth signal.

3. The method of claim 1, further comprising generating a set of divider ratios including the current divider ratio to ramp a current frequency of the output clock signal to a target frequency.

4. The method of claim 3, wherein generating the set of divider ratio comprises:
   selecting a first set of same denominators for a first subset of the set of divider ratios; and
   selecting a second set of one or more same denominators for a second subset of the set of divider ratios.

5. The method of claim 4, wherein each of the same denominators of the first set is less than each of the one or more same denominators of the second set.

6. The method of claim 4, wherein the first set of same denominators are used to achieve a majority of the ramp of the current frequency to the target frequency.

7. The method of claim 4, wherein the first set of same denominators are used to achieve at least a defined percentage of the ramp of the current frequency to the target frequency.

8. The method of claim 4, further comprising selecting a set of sequential numerators for the first subset of divider ratios.

\* \* \* \* \*